(12) United States Patent
Han et al.

(10) Patent No.: US 10,573,695 B2
(45) Date of Patent: Feb. 25, 2020

(54) DISPLAY DEVICE

(71) Applicant: WUHAN CHINA STAR OPTOELECTRONICS TECHNOLOGY CO., LTD, Wuhan, Hubei (CN)

(72) Inventors: Wen Han, Hubei (CN); Rong Ma, Hubei (CN); Jichuan Liu, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 183 days.

(21) Appl. No.: 15/569,620

(22) PCT Filed: Jun. 20, 2017

(86) PCT No.: PCT/CN2017/089242
§ 371 (c)(1),
(2) Date: Oct. 26, 2017

(87) PCT Pub. No.: WO2018/171058
PCT Pub. Date: Sep. 27, 2018

(65) Prior Publication Data
US 2018/0366522 A1    Dec. 20, 2018

(30) Foreign Application Priority Data

Mar. 21, 2017 (CN) .......................... 2017 1 0169424

(51) Int. Cl.
| | | |
|---|---|---|
| *G09F 9/30* | (2006.01) | |
| *H01L 27/32* | (2006.01) | |
| *F16C 13/00* | (2006.01) | |
| *H01L 51/00* | (2006.01) | |

(52) U.S. Cl.
CPC .......... *H01L 27/3225* (2013.01); *F16C 13/00* (2013.01); *G09F 9/301* (2013.01); *H01L 51/0097* (2013.01); *H01L 2251/5338* (2013.01)

(58) Field of Classification Search
CPC ............. H01L 27/3225; H01L 51/0097; H01L 2251/5338; G09F 9/301; F16C 13/00
USPC .................................................... 40/472, 512
See application file for complete search history.

(56) References Cited

U.S. PATENT DOCUMENTS

| | | | | |
|---|---|---|---|---|
| 2,073,252 A | * | 3/1937 | Palmer | ..................... G01K 1/02 374/187 |
| 3,395,472 A | * | 8/1968 | Look | ....................... G09F 11/26 40/472 |
| 5,018,289 A | * | 5/1991 | Gelman | .................. G09F 11/15 40/472 |

(Continued)

FOREIGN PATENT DOCUMENTS

| | | |
|---|---|---|
| CN | 101952788 A | 1/2011 |
| CN | 102902308 A | 1/2013 |

(Continued)

*Primary Examiner* — Cassandra Davis
(74) *Attorney, Agent, or Firm* — Mintz Levin Cohn Ferris Glovsky and Popeo, P.C.; Steven M. Jensen

(57) ABSTRACT

The invention provides a display device. The display device including: a driving mechanism; a rolling mechanism; and a flexible display, the flexible display is supported by the rolling mechanism, and the driving mechanism drives the rolling mechanism to roll in cycles. The display device of the present invention can realize rotational display, thereby satisfying the diversified demand of users.

19 Claims, 3 Drawing Sheets

(56) References Cited

U.S. PATENT DOCUMENTS

2014/0099479 A1  4/2014 Krall et al.
2016/0081204 A1  3/2016 Park et al.

FOREIGN PATENT DOCUMENTS

| CN | 103177670 A  | 6/2013 |
| CN | 203616960 U  | 5/2014 |
| CN | 105518766 A  | 4/2016 |
| CN | 106782096 A  | 5/2017 |
| WO | 2013076710 A2 | 5/2013 |

\* cited by examiner

DISPLAY DEVICE

CROSS-REFERENCES TO RELATED APPLICATIONS

This application is a U.S. national phase application, pursuant to 35 U.S.C. § 371, of PCT/CN2017/089242, filed Jun. 20, 2017, designating the United States, which claims priority to Chinese Application No. 201710169424.4, filed Mar. 21, 2017. The entire contents of the aforementioned patent applications are incorporated herein by this reference.

BACKGROUND

Field

The invention belongs to the field of display technology, specifically, relates to a display device capable of changing degree of curvature and achieving rotational display.

Description of the Related Art

In recent years, major players in the art have launched curved display devices one after another. Generally speaking, curved display device can provide best viewing effect from edge to edge, while ordinary flat panel display device has been undesirable in the viewing effect at the edges of screen. The whole screen of curved display device is designed to surround the user with an arc shape in the direction of facing user, which may provide a broad full-view image effect. No matter whether the user is in the position facing the central portion of the screen or around the edges thereof, the display can bring the same visual enjoyment to the user, and the off-axis viewing distortion is also reduced when viewing at a near distance. Further, a curved display device can prolong the viewing distance for users, achieving better viewing experience.

Currently, during the process of manufacturing curved display device, first, a flat panel display device is pre-bent to have a certain degree of curvature through certain process, and then it is fixed so as to form a curved display device. However, this curved display device is constant in terms of curvature, and cannot achieve a rotational display; therefore, it cannot satisfy the diversified demand of users.

SUMMARY

To solve the problems existing in the art, the present invention provides a display device capable of changing curvature thereof and achieving a rotational display.

According to one aspect of this invention, a display device is provided, the display device including: a driving mechanism, a rolling mechanism, and a flexible display, the flexible display is supported by the rolling mechanism, and the driving mechanism drives the rolling mechanism to roll in cycles.

Alternatively, the driving mechanism may include: a driving gear, a driven gear, and a rotational driving part; the rolling mechanism includes a transmission chain; the driving gear and the driven gear are disposed opposing each other; the transmission chain is engaged with the driving gear and the driven gear, and the flexible display is supported by the transmission chain; the rotational driving part is disposed inside the driving gear, and the rotational driving part is used to drive the driving gear to rotate.

Alternatively, the distance between the centers of the driving gear and the driven gear may be adjustable, thereby adjusting the curvature of the flexible display.

Alternatively, the driving mechanism may include a driving wheel, a driven wheel and a rotational driving part, the rolling mechanism includes a transmission belt; the driving wheel and the driving wheel are disposed opposing each other, the transmission belt is provided on the outside of the driving wheel and the driven wheel, the flexible display is supported by and fixed to the transmission belt, the rotational driving part is disposed inside the driving wheel, the rotational driving part is used to drive the driving wheel to rotate.

Alternatively, the distance between the centers of the driving wheel and the driven wheel may be adjustable, thereby adjusting the curvature of the flexible display.

Alternatively, the rotational driving part may include a clockwork structure or a driving motor.

Alternatively, the display device may further include a connection buffer protective layer, the connection buffer protective layer is disposed between the transmission chain and the flexible display, and the connection buffer protective layer fixed to the flexible display and the transmission chain in the manner of bonding, respectively.

Alternatively, the display device may further include a connection buffer protective layer, the connection buffer protective layer is disposed between the transmission chain and the flexible display, and fixed to the flexible display in the manner of bonding, a surface of the connection buffer protective layer towards the transmission belt has a plurality of convex teeth, the convex teeth is engaged with the transmission chain so as to connect and fix the connection buffer protective layer to the transmission chain.

Alternatively, the display device may further include a connection buffer protective layer, the connection buffer protective layer is disposed between the transmission belt and the flexible display, and fixed to the flexible display and the transmission belt in the manner of bonding, respectively.

Alternatively, the flexible display may be a flexible organic electroluminescent display.

Beneficial Effect of the Present Invention

The display device according to the invention has a curvature being adjustable according to actual needs, and can achieve rotational display, thereby satisfying the diversified demand of users.

BRIEF DESCRIPTION OF DRAWINGS

The above and other aspects, features, and advantages of the embodiments of present invention will be clearer from the following description taken in conjunction with the accompanying drawings, in which.

DETAILED DESCRIPTION

Figure 1:
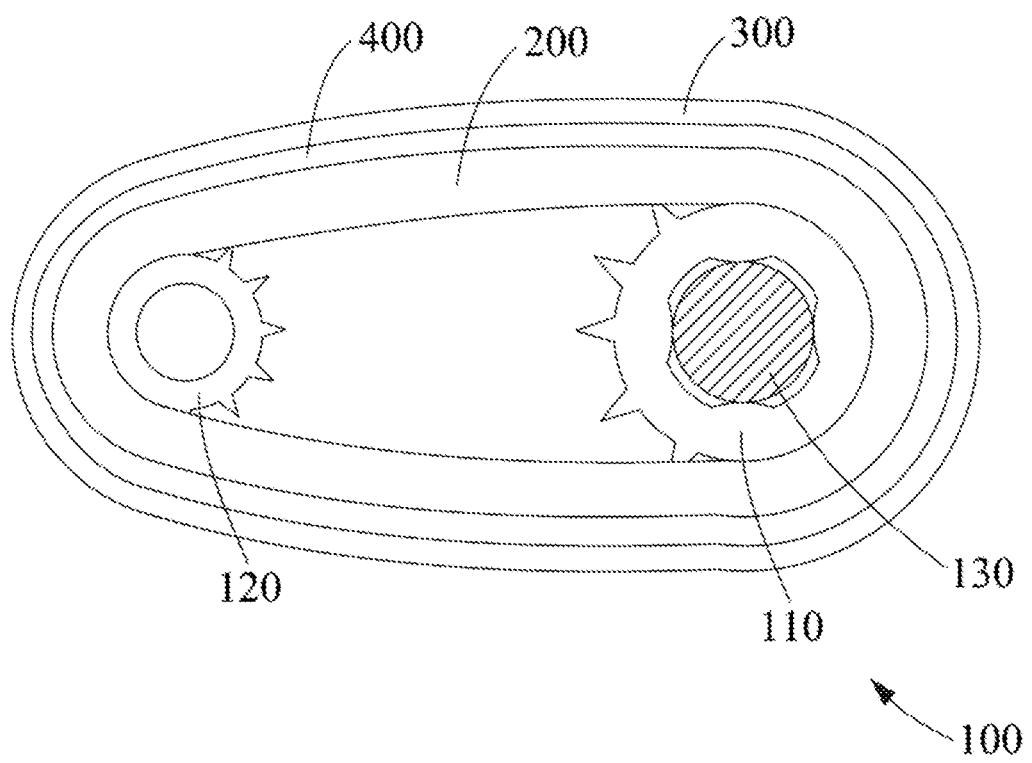
FIG. 1 is a structural view of a display device according to the first embodiment of present invention.

Hereinafter, embodiments of the present invention will be described in detail with reference to the attached drawings. The present invention may, however, be implemented in many different forms, and should not be construed as being limited by the specific embodiments set forth herein. On the contrary, these embodiments are provided to explain the principle of present invention and its practical application, so that others skilled in the art can understand various embodiments and modifications applicable to specific intended applications of present invention.

In the drawings, the shape and size of elements may be exaggerated for clarity, and the same reference numerals will always be used to indicate the same or similar elements.

Figure 2:
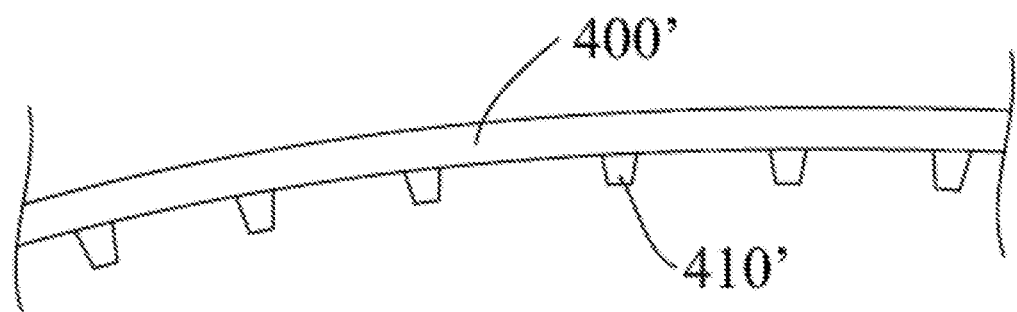
FIG. 2 is a partial view of a connection buffer protective layer according to the second embodiment of present invention.

FIG. 1 is a structural view of a display device according to the first embodiment of present invention. FIG. 2 is a partial view of a connection buffer protective layer according to the second embodiment of present invention.

Referring to FIG. 1, a display device according to the first embodiment of present invention includes: a driving mechanism 100, a rolling mechanism 200, and a flexible display 300. The flexible display 300 is supported by the rolling mechanism 200, and the driving mechanism 100 drives the rolling mechanism 200 to roll in cycles, thereby driving the flexible display 300 to roll and rotate.

Specifically, as a way of implementing the invention, the driving mechanism 100 includes: a driving gear 110, a driven gear 120 and a rotational driving part 130. In the present invention, the numbers of the driving gear 110 and the driven gear 120 are not limited, and may be determined depending on actual needs. The rolling mechanism 200 is a transmission chain, or being referred to as O type transmission chain.

During the process of assembly, the driving gear 110 and the driven gear 120 are disposed opposing each other, and the axial direction of the driving gear 110 and the driven gear 120 is perpendicular to the transmission direction of the transmission chain 200. The transmission chain 200 is engaged with the driving gear 110 and the driven gear 120, and the rotational driving part 130 is disposed inside the driving gear 110. The rotational driving part 130 can drive the driving gear 110 to rotate. In this way, after the driving gear 110 begins to rotate, the driving gear 110 transmits the driving force to the driven gear 120 through the transmission chain 200, to have the driven gear 120 rotate, and then the transmission chain 200 is driven to rotate in cycles. The flexible display 300 is supported by the transmission chain 200. Further, the outer surface of the transmission chain 200 is fixedly covered with the flexible display 300, that is, the flexible display 300 has a shape substantially corresponding to that of the transmission chain 200, namely also presents an O shape. When the transmission chain 200 rotates in cycles, the flexible display 300 also rotates in cycles, thereby achieving a rotational display.

In the embodiment, preferably, the rotational driving part 130 is a clockwork spring structure or a driving motor, but the present invention is not limited thereto, and the rotational driving part 130 may be other suitable types of elements capable of providing rotational driving force.

The above-mentioned integrated O type flexible display 300 is relatively complicated to manufacture during the process of manufacturing which leads to an increase in cost. Therefore, in order to reduce the complexity of manufacturing, as an alternative way of implementing present invention, it may adopt several flexible displays of relatively smaller size, and these flexible displays of relatively smaller size may be jointed together to form above-mentioned integrated O type flexible display 300, which may reduce cost.

Further, in order to achieve adjusting a curvature of the flexible display 300, in the present embodiment, preferably, the distance between the centers of the driving gear 110 and the driven gear 120 may be adjustable. Specifically, an adjustment control mechanism (not shown) may be provided. The adjustment control mechanism adjusts the distance between the centers of the driving gear 110 and the driven gear 120 according to externally input parameters in relation to the curvature of the flexible display 300.

In addition, in order to achieve protection of the flexible display 300 and ease of fixed connection of the flexible display 300, the display device according to the first embodiment of present invention also includes a connection buffer protective layer 400, which is provided between the flexible display 300 and the transmission chain 200 to connect and to be fixed to the flexible display 300 and the transmission chain 200, respectively. In the present embodiment, preferably, the connection buffer protective layer 400 and the flexible display 300 may be fixed in the manner of bonding through such as adhesives, double-sided tape or the like, and the connection buffer protective layer 400 and the transmission chain 200 may be fixed in the manner of bonding through such as adhesives, double-sided tape, or the like.

As an alternative way of implementing the present invention, referring to FIG. 2, a surface of the connection buffer protective layer 400' towards the transmission chain 200 has a plurality of convex teeth 410', which may engage with the transmission chain 200. However, the depth of engagement between the convex teeth 410' and the transmission chain 200 should not interfere with engagement of the driving gear 110 and the driven gear 120 with the transmission chain 200.

It should be explained that, in the present invention, the fixation manners between the connection buffer protective layer 400 and the flexible display 300 and between the connection buffer protective layer 400 and the transmission chain 200 are not limited to the above mentioned fixation manner.

Figure 3:
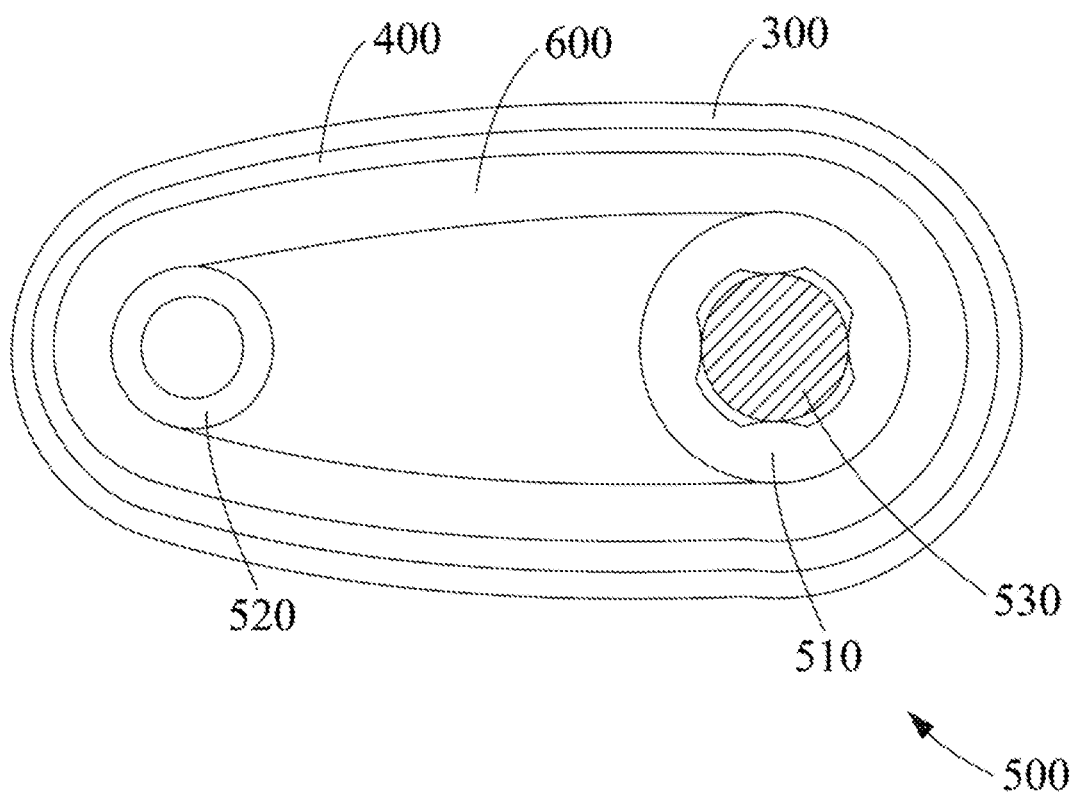
FIG. 3 is a structural view of a display device according to the third embodiment of present invention.

FIG. 3 is a structural view of a display device according to the third embodiment of present invention.

Referring to FIG. 3, a display device according to the third embodiment of present invention includes: a driving mechanism 500, a rolling mechanism 600, and a flexible display 300. The flexible display 300 is supported by the rolling mechanism 600, and the driving mechanism 500 drives the rolling mechanism 600 to roll in cycles, thereby driving the flexible display 300 to roll and rotate.

Specifically, as a way of implementing the present invention, the driving mechanism 500 includes: a driving wheel 510, a driven wheel 520 and a rotational driving part 530. In the present invention, the numbers of the driving wheel 510 and the driven wheel 520 are not limited, and may be determined depending on actual needs. The rolling mechanism 600 is a transmission belt, or being referred to as O type transmission belt.

During the process of assembly, the driving wheel 510 and the driven wheel 520 are disposed opposing each other, and the axial direction of the driving wheel 510 and the driven wheel 520 is perpendicular to the transmission direction of the transmission belt 600. The transmission belt 600 is mounted on the driving wheel 510 and the driven wheel 520, and the rotational driving part 530 is disposed inside the driving wheel 510. The rotational driving part 530 can drive the driving wheel 510 to rotate. In this way, after the driving wheel 510 begins to rotate, the driving wheel 510 transmits the driving force to the driven wheel 520 through the transmission belt 600, to have the driven wheel 520 rotate, and then drives the transmission belt 600 to rotate in cycles. The flexible display 300 is supported by the transmission belt 600. Further, the outer surface of the transmission belt 600 is fixedly covered with the flexible display 300, that is, the flexible display 300 has a shape substantially corresponding to that of the transmission belt 600, namely also in a shape of an O type. When the transmission belt 600 rotates in cycles, the flexible display 300 also rotates in cycles, thereby achieving a rotational display.

In the present embodiment, preferably, the rotational driving part 530 is a clockwork spring structure or a driving motor, but the present invention is not limited thereto, and the rotational driving part 530 may be other suitable types of elements capable of providing rotational driving force.

The above-mentioned integrated O type flexible display 300 is relatively complicated to manufacture during the process of manufacturing, thereby leading to an increase in cost. Therefore, in order to reduce the complexity of manufacturing, an alternative way of implementing present invention, it may adopt several flexible displays of relatively smaller size, and these flexible displays of relatively smaller size may be jointed together to form above-mentioned integrated O type flexible display 300, which may reduce cost.

Further, in order to achieve adjusting curvature of the flexible display 300, in the present embodiment, preferably, the distance between the centers of the driving wheel 510 and the driven wheel 520 can be adjusted. Specifically, an adjustment control mechanism (not shown) may be provided. The adjustment control mechanism adjusts the distance between the centers of the driving wheel 510 and the driven wheel 520 according to externally input parameters in relation to the curvature of the flexible display 300.

In addition, in order to achieve protection on the flexible display 300 and ease of fixed connection of the flexible display 300, the display device according to the third embodiment of the present invention also includes a connection buffer protective layer 400, which is provided between the flexible display 300 and the transmission belt 600 to connect and to be fixed to the flexible display 300 and the transmission belt 600, respectively. In the present embodiment, preferably, the connection buffer protective layer 400 and the flexible display 300 may be fixed in the manner of bonding through such as adhesives, double-sided tape or the like, and the connection buffer protective layer 400 and the transmission belt 600 may be fixed in the manner of bonding through such as adhesives, double-sided tape, or the like.

It should be noted that, in the present invention, the fixation manner between the connection buffer protective layer 400 and the flexible display 300, and the fixation manner between the connection buffer protective layer 400 and the transmission belt 600 are not limited to the above mentioned fixation manner.

In addition, in the various embodiments mentioned above, preferably, the flexible display 300 is a flexible organic electroluminescent display or being referring to as flexible OLED display, but the present invention is not limited thereto.

In conclusion, the display device according to the various embodiments of the present invention has a curvature being adjustable according to actual needs, and may achieve a rotational display; therefore, it may satisfy the diversified demands of users.

Although the present invention has been illustrated and shown with reference to specific embodiments, those skilled in the art will appreciate that various changes in form and detail may be made herein without departing from the spirit and scope of present invention defined by the claims and its equivalents.

What is claimed is:

1. A display device, comprising:
a driving mechanism;
a rolling mechanism; and
a flexible display,
wherein the flexible display is supported by the rolling mechanism, and the driving mechanism is adapted to drive the rolling mechanism to roll in cycles, and
wherein the flexible display is flexible organic electroluminescent display.

2. The display device of claim 1, wherein, the driving mechanism includes: a driving gear, a driven gear, and a rotational driving part;
the rolling mechanism includes a transmission chain;
the driving gear and the driven gear are disposed opposing each other;
the transmission chain is engaged with the driving gear and the driven gear, and the flexible display is supported by the transmission chain;
the rotational driving part is disposed inside the driving gear, and the rotational driving part is adapted to drive the driving gear to rotate.

3. The display device of claim 2, wherein,
a distance between the centers of the driving gear and the driven gear is adjustable, thereby adjusting the curvature of the flexible display.

4. The display device of claim 2, wherein,
the rotational driving part includes a clockwork spring structure or a driving motor.

5. The display device of claim 2, wherein, the display device further includes a connection buffer protective layer, the connection buffer protective layer is disposed between the transmission chain and the flexible display, and the connection buffer protective layer fixed to the flexible display and the transmission chain in a manner of bonding, respectively.

6. The display device of claim 2, wherein, the display device further includes a connection buffer protective layer,
the connection buffer protective layer is disposed between the transmission chain and the flexible display, and fixed to the flexible display in a manner of bonding, a surface of the connection buffer protective layer facing the transmission chain has a plurality of convex teeth, the convex teeth are engaged with the transmission chain so as to connect and fix the connection buffer protective layer to the transmission chain.

7. The display device of claim 1, wherein,
the driving mechanism includes a driving wheel, a driven wheel and a rotational driving part, the rolling mechanism includes a transmission belt; the driving wheel and the driven wheel are disposed opposing each other, the transmission belt is mounted on the driving wheel and the driven wheel, the flexible display is supported by and fixed to the transmission belt, the rotational driving part is disposed inside the driving wheel, the rotational driving part is used to drive the driving wheel to rotate.

8. The display device of claim 7, wherein,
a distance between the centers of the driving wheel and the driven wheel is adjustable, thereby adjusting the curvature of the flexible display.

9. The display device of claim 7, wherein,
the rotational driving part includes a clockwork spring structure or a driving motor.

10. The display device of claim 7, wherein, the display device further includes a connection buffer protective layer, the connection buffer protective layer is disposed between the transmission belt and the flexible display, and fixed to the flexible display and the transmission belt in a manner of bonding, respectively.

11. A display device, comprising:
a driving mechanism;
a rolling mechanism; and
a flexible display,
wherein the flexible display is supported by the rolling mechanism, and the driving mechanism is adapted to drive the rolling mechanism to roll in cycles, and
wherein the driving mechanism includes a rotational driving part configured as a clockwork spring structure.

12. The display device of claim 11, wherein the driving mechanism further includes a driving gear and a driven gear that are disposed opposing each other,
wherein the rolling mechanism includes a transmission chain engaged with the driving gear and the driven gear,
wherein the flexible display is supported by the transmission chain, and
wherein the rotational driving part is disposed inside the driving gear, and the rotational driving part is adapted to drive the driving gear to rotate.

13. The display device of claim 12, wherein a distance between centers of the driving gear and the driven gear is adjustable, thereby adjusting the curvature of the flexible display.

14. The display device of claim 12, wherein, the display device further includes a connection buffer protective layer, the connection buffer protective layer is disposed between the transmission chain and the flexible display, and the connection buffer protective layer fixed to the flexible display and the transmission chain in a manner of bonding, respectively.

15. The display device of claim 12, wherein, the display device further includes a connection buffer protective layer, the connection buffer protective layer is disposed between the transmission chain and the flexible display, and fixed to the flexible display in a manner of bonding, a surface of the connection buffer protective layer facing the transmission chain has a plurality of convex teeth, the convex teeth are engaged with the transmission chain so as to connect and fix the connection buffer protective layer to the transmission chain.

16. The display device of claim 11, wherein the driving mechanism further includes a driving wheel and a driven wheel that are disposed opposing each other,
wherein the rolling mechanism includes a transmission belt mounted on the driving wheel and the driven wheel,
wherein the flexible display is supported by and fixed to the transmission belt, and
wherein the rotational driving part is disposed inside the driving wheel, the rotational driving part is adapted to drive the driving wheel to rotate.

17. The display device of claim 16, wherein a distance between centers of the driving wheel and the driven wheel is adjustable, thereby adjusting the curvature of the flexible display.

18. The display device of claim 16, wherein, the display device further includes a connection buffer protective layer, the connection buffer protective layer is disposed between the transmission belt and the flexible display, and fixed to the flexible display and the transmission belt in a manner of bonding, respectively.

19. The display device of claim 11, wherein the flexible display is a flexible organic electroluminescent display.

* * * * *